United States Patent [19]
Dodabalapur et al.

[11] Patent Number: 5,574,291
[45] Date of Patent: Nov. 12, 1996

[54] ARTICLE COMPRISING A THIN FILM TRANSISTOR WITH LOW CONDUCTIVITY ORGANIC LAYER

[75] Inventors: Ananth Dodabalapur, Millington; Howard E. Katz, Summit; Luisa Torsi, Murray Hill, all of N.J.

[73] Assignee: Lucent Technologies Inc., Murray Hill, N.J.

[21] Appl. No.: 353,032

[22] Filed: Dec. 9, 1994

[51] Int. Cl.$^6$ ............ H01L 35/24; H01L 51/00; H01L 29/76; H01L 27/01
[52] U.S. Cl. ............ 257/40; 257/289; 257/347; 257/410; 257/642
[58] Field of Search ............ 257/40, 289, 410, 257/347, 642

[56] References Cited

U.S. PATENT DOCUMENTS

| | | | |
|---|---|---|---|
| 5,247,190 | 9/1993 | Friend et al. | 257/40 |
| 5,315,129 | 5/1991 | Forrest et al. | 257/21 |
| 5,355,235 | 10/1994 | Nishizawa et al. | 257/40 |

FOREIGN PATENT DOCUMENTS 3-236286  10/1991  Japan ............ 257/40

OTHER PUBLICATIONS

"All–Polymer Field–Effect Transistor Realized by Printing Techniques", by F. Garnier et al., *Science*, vol. 265, 16 Sep. 1994, pp. 1684–1686.

"Polythiophene Field–Effect Transistor With Polypyrrole Worked as Source and Drain Electrodes", by H. Koezuka et al., *Appl. Phys. Lett.*, vol. 62(15), 12 Apr. 1993, pp. 1794–1796.

"Polythienylenevinylene Thin–Film Transistor with High Carrier Mobility", by H. Fuchigami et al., *Appl. Phys. Lett.*, vol. 63(10), 6 Sep. 1993, pp. 1372–1374.

"An Analytical Model for Organic–Based Thin–Film Transistors", by G. Horowitz et al., *J. Appl. Phys.*, vol. 70(1), 1 Jul. 1991, pp. 469–475.

"Thin–Film Transistors Based on Alpha–Conjugated Oligomers", by G. Horowitz et al., *Synthetic Metals*, vol. 41–43 (1991), pp. 1127–1130. no month.

"Junction Field–Effect Transistor Using Polythiophene as an Active Component", by S. Miyauchi et al., *Synthetic Metals.*, vol. 41–43 (1991), pp. 1155–1158. no month.

*Chemical Abstracts*, vol. 114, p. 22, item 186387g (1991). no month.

"X–Ray Determination of the Crystal Structure and Orientation of Vacuum Evaporated Sexithiophene Films", by B. Servet et al., *Advanced Materials*, vol. 5, No. 6, p. 461 (1993). no month.

"Polymorphism and Charge Transport in Vacuum–Evaporated Sexithiophene Films", by B. Servet et al., *Chemistry of Materials*, vol. 6, (1994), p. 1809. no month.

"Amorphous and Microcrystalline Devices", J. Kanicki, editor, Artech House, Boston (1991) pp. 102–103. no month.

*Primary Examiner*—Mahshid Saadat
*Attorney, Agent, or Firm*—Eugen E. Pacher

[57] ABSTRACT

Organic thin film transistors having improved properties (e.g., on/off ratio>$10^5$ at 20° C.) are disclosed. The improved transistors comprise an organic active layer of low conductivity (<$5\times10^{-8}$ S/cm at 20° C., preferably less than $10^{-8}$ or even $10^{-9}$ S/cm). A method of producing such materials is disclosed. Rapid thermal annealing was found to have beneficial results. An exemplary and preferred material is α-hexathienylene (α-6T). The improved transistors are expected to find use for, e.g., active liquid crystal displays and for memories.

7 Claims, 4 Drawing Sheets

5,574,291

ARTICLE COMPRISING A THIN FILM TRANSISTOR WITH LOW CONDUCTIVITY ORGANIC LAYER

FIELD OF THE INVENTION

This invention pertains to thin film transistors (TFTs) that comprise an organic active layer, and to methods of making such transistors.

BACKGROUND OF THE INVENTION

Thin film transistors (TFTs) are known, and are of considerable commercial significance. For instance, amorphous silicon-based TFTs are used in a large fraction of active matrix liquid crystal displays.

TFFs with an organic active layer are also known. See, for instance, F. Garnier et al., *Science*, Vol. 265, pp. 1684–1686; H. Koezuka et at., *Applied Physics Letters*, Vol. 62 (15), pp. 1794–1796; H. Fuchigami et al., *Applied Physics Letters*, Vol. 63 (10), pp. 1372–1374; G. Horowitz et al., *J. Applied Physics*, Vol. 70 (1), pp. 469–475, and G. Horowitz et al., *Synthetic Metals*, vol. 41–43, pp. 1127–1130. These devices typically are field effect transistors (FETs). Such devices potentially have significant advantages over conventional TFTs, including a potentially simpler (and consequently cheaper) fabrication process, the possibility for low temperature processing, and compatibility with non-glass (e.g, plastic) substrates. Bipolar transistors that utilize both p-type and n-type organic material are also known. See, for instance, U.S. Pat. No. 5,315,129. S. Miyauchi et al., *Synthetic Metals*, 41–43 (1991), pp. 1155–1158, disclose a junction FET that comprises a layer of p-type polythiophene on n-type silicon.

However, despite considerable research and development effort, "organic" TFTs have not yet reached commercialization, at least in part due to the relatively poor device characteristics of prior art organic TFTs.

An important device characteristic of a switching transistor is the on/off ratio of the source/drain current. Prior art organic TFTs typically have relatively low on/off ratios. For instance, H. Fuchigami et al. (op. cit.) recently reported a device that had carrier mobility comparable to amorphous silicon, but had an on/off ratio of only about 20. That paper also discloses purification of semiconducting material (PTV) to reduce the carrier scattering by impurities. The material had a conductivity in the range $10^{-5}$–$10^{-6}$ S/cm.

H. Koezuka et al. (op. cit.) report attainment of an on/off ratio (modulation ratio) of the channel current of about $10^5$ in a device with doped polypyrole (a highly conducting polymer)-coated source and drain contacts. According to these authors, this is the highest on/off ratio achieved in organic FETs. Nevertheless, the reported on/off ratio is still substantially smaller than on/off ratios typically available in conventional FETs and demanded for many potential applications of organic TFTs. Furthermore, the organic TFT had very low carrier mobility ($2 \times 10^{-4}$ cm$^2$/V.s), and thus would not have been suitable for high-speed operation.

In view of the potential significance of organic TFTs, it would be desirable to have available such devices that have improved characteristics, including improved on/off ratio of the source/drain current. This application discloses such devices, and a method of making the devices.

Definitions and Glossary

An "organic semiconductor" herein is a material that contains a substantial amount of carbon in combination with other elements, or that comprises an allotrope of elemental carbon (excluding diamond), and exhibits charge carrier mobility of at least $10^{-3}$ cm$^2$/V.s at room temperature (20° C.). Organic semiconductors of interest for TFTs typically have conductivity less than about 1 S/cm at 20° C.

A "p-type" ("n-type") organic semiconductor herein is an organic semiconductor in which the Fermi energy is closer to (farther from) the energy of the highest occupied orbital of the molecules or aggregates present in the material than it is to (from) the energy of the lowest unoccupied orbital. The term is also intended to mean an organic semiconductor which transports positive charge carriers more (less) efficiently than negative carriers. Positive (negative) carriers are generally referred to as "holes" ("electrons").

SUMMARY OF THE INVENTION

In a broad aspect the invention is embodied in an article that comprises a novel organic TFT that can have substantially improved characteristics (e.g., on/off ratio), as compared to prior art organic TFTs. A method of making the article is also disclosed.

Specifically, the organic TFT comprises an organic material layer, spaced apart first and second contact means (e.g., gold electrodes) in contact with said layer, and third contact means that are spaced from each of the first and second contact means and that are adapted for controlling, by means of a voltage applied to the third contact means, a current between the first and the second contact means through said layer. Significantly, the organic material of the layer is selected from the group consisting of α-quaterthienylene (α-4T), α-hexathienylene (α-6T), α-octathienylene (α-8T), α-pentathienylene (α-5T), α-heptathienylene (α-7T), and α-nonathienylene (α-9T), each with or without substituents on the 4 or 5 carbon of the terminal rings (these compounds will collectively be referred to as "α-nT", with n being an integer from 4 to 9), said organic material layer having an electrical conductivity of at most $5 \times 10^{-8}$ S/cm (preferably less than $1 \times 10^{-8}$ S/cm) at 20° C., either in the as-deposited condition or subsequent to a rapid thermal anneal. In currently preferred embodiments the organic layer material is α-6T or α-8T, with α-6T being most preferred.

We have made the surprising discovery that, for example, α-6T can be produced and deposited in a manner that results in a layer of extremely low conductivity, and that a TFT that comprises such a low-conductivity active layer can have greatly improved properties, including a substantially improved source/drain current on/off ratio. Indeed, TFTs that comprise the novel active layer material can have an on/off ratio that is comparable to those of the novel (2-layer) TFTs described in the concurrently filed co-assigned patent application by the same inventors of title "Article Comprising an Organic Thin Film Transistor". Thus, TFTs according to the, instant invention will typically, but not necessarily, comprise a single organic layer, the "active" layer (but not excluding the presence of, e.g., a protective layer over said active layer).

In a further aspect the invention is embodied in a method of making a TFT that comprises an α-mT (m=4, 6 or 8) active layer. The method comprises providing a quantity of α-mT, and depositing a layer of the α-mT on a substrate. The α-mT is produced by a process that comprises providing α-(m/2) thienyl, de-protonated in the 5-position, in an organic solvent. Significantly, the process of producing said α-mT still further comprises contacting said α-(m/2) thienyl in the organic solvent with a non-halogenating oxidizing agent such that an α-mT-containing mixture is formed, and isolating said α-mT from the mixture. As will be described later in detail, the "isolating" step comprises a multiplicity of substeps.

Although the discussion below will be primarily in terms of α-6T, we currently believe that many if not all of the other members of the above defined group α-nT can also be synthesized/treated to meet the specified conductivity requirement. A prior art method of making compounds such as α-6T is disclosed in *Chemical Abstracts*, Vol. 114, p. 22, item 186387g (1991).

As will be discussed in detail below, α-6T according to the invention differs from prior art α-6T not only with regard to carrier concentration but typically also with regard to such characterizing properties as melting point, X-ray diffraction pattern and elemental analysis. Similar differences are expected for α-4T and α-8T, and indeed for all α-nT. These differences support the conclusion that the active layer materials according to the invention are essentially new materials that differ qualitatively from the analogous prior art materials. However, we will refer to materials according to the invention by the chemical names that have commonly been used to refer to the analogous prior art materials.

Exemplarily, a TFT according to the invention, with α-6T active layer, has exhibited in the as-deposited condition an on/off ratio of more than $10^6$ at 20° C., substantially higher (e.g., by a factor of $10^2$) than the ratios typically exhibited by prior art organic TFTs. The active layer of the exemplary TFT according to the invention was only lightly p-type at 20° C.

DETAILED DESCRIPTION

Figure 1:
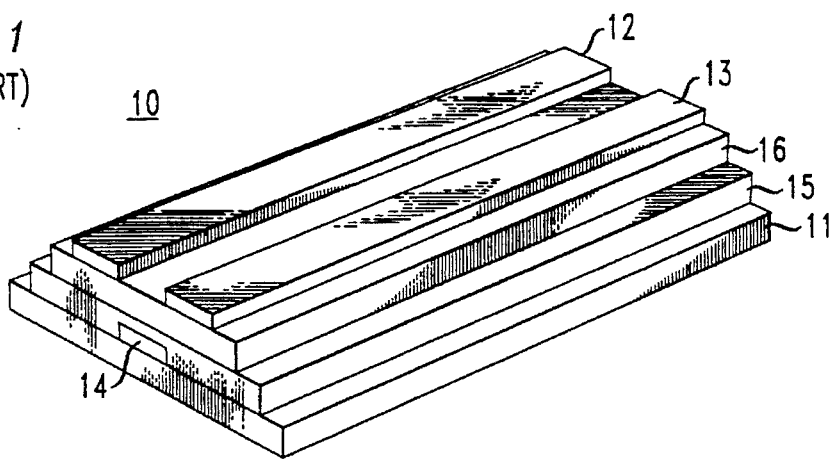
FIG. 1 schematically shows an exemplary prior art TFT.

FIG. 1 schematically depicts a prior art organic TFT 10 of the metal-insulator-semiconductor field effect transistor (MIS-FET) type, wherein numerals 11–16 refer, respectively, to substrate, first electrode (e.g., source electrode), second electrode (e.g., drain electrode), third electrode (gate electrode), insulator layer, and active layer.

Figure 2:
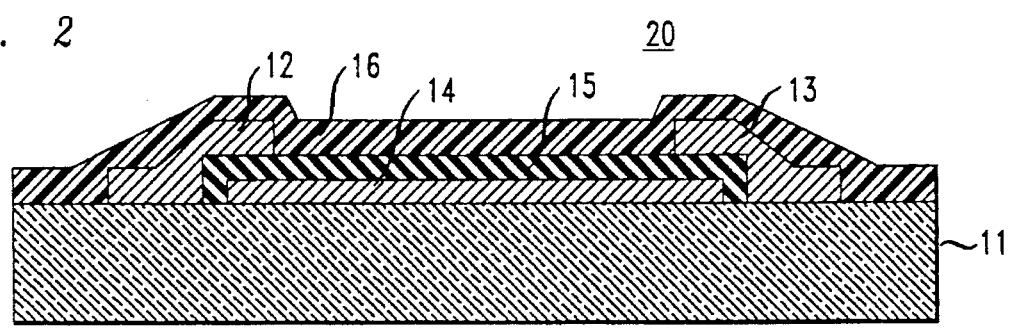
FIGS. 2 and 3 schematically depict exemplary TFTs according to the invention.

FIG. 2 schematically shows a MIS-FET type device according to the invention. The transistor 20 also comprises substrate 11 (e.g., a glass, silicon or plastic body), first and second contacts 12 and 13, third contact 14, gate dielectric 15 and active layer 16. It will be recognized that topologically transistor 20 is the same as prior an transistor 10. However, the former comprises an active layer material that differs significantly from prior art materials, resulting in substantially improved performance (e.g., substantially higher on/off ratio of the source/drain current), as compared to prior art organic TFFs.

Figure 3:
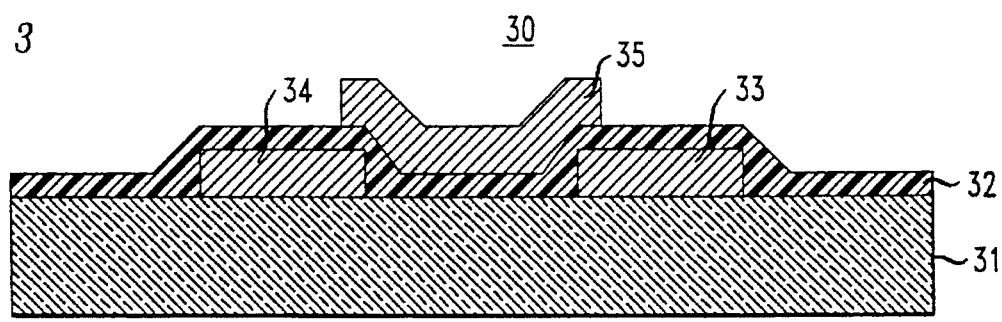

FIG. 3 schematically depicts another embodiment of the invention, namely, an organic TFT of the metal-semiconductor (MES)-FET type. Numerals 31–35 designate, respectively, substrate, active layer, first, second and third contacts.

By way of example, MIS-FET type TFTs according to the invention, with 12 μm channel length and 250 μm gate length, were fabricated on thermally oxidized, conductive Si substrates. The oxide, serving as gate dielectric, was 300 nm thick. The gate region was accessed by a gold ohmic contact to the Si, and gold source and drain contacts were lithographically defined on the silicon oxide. The organic active layer was then formed by evaporation onto the entire assembly at room temperature and at a pressure of $10^{-6}$ torr. The active layer was 50 nm thick, and was not heat treated. Measurements were made in situ, in vacuum.

Figure 4:
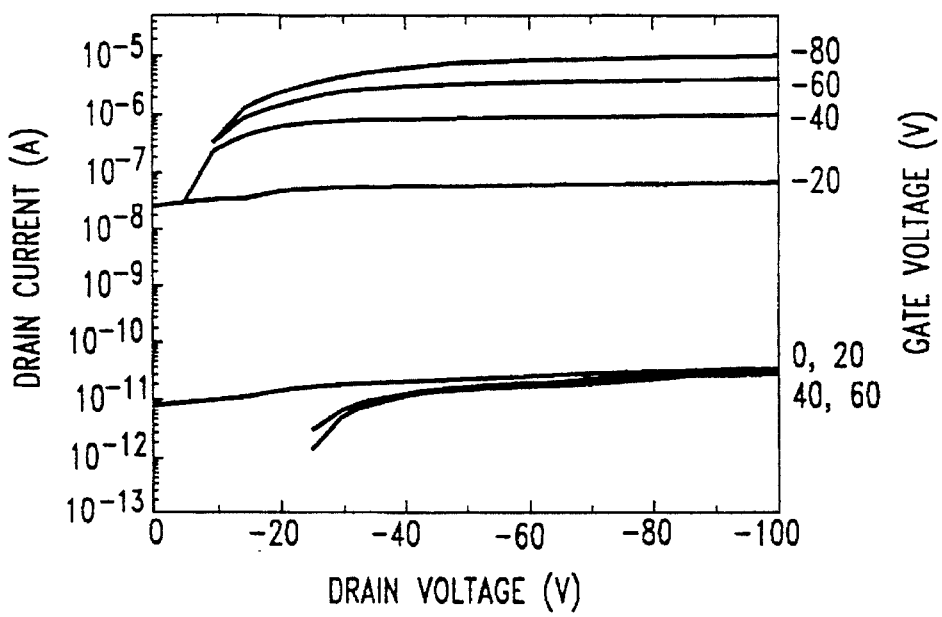
FIGS. 4 and 5 show data on drain current vs. drain voltage for 2 TFTs according to the invention, of somewhat different conductivities.

FIG. 4 shows curves of drain current vs. drain voltage obtained from an exemplary TFT as described above, with the active layer material (α-6T) prepared as described in detail below.

The off-current (gate voltage 0 or positive, drain voltage −100 V) was about $10^{-11}$ A, and the on/off ratio was greater than $10^6$. The as deposited α-6T at 20° C. had a conductivity below $10^{-8}$ S/cm, (approximately $10^{-9}$ S/cm), and was barely p-type (i.e., it was substantially intrinsic), as those skilled in the art will recognize from the substantial overlap of the curves for 0–60 V gate voltage.

Figure 5:
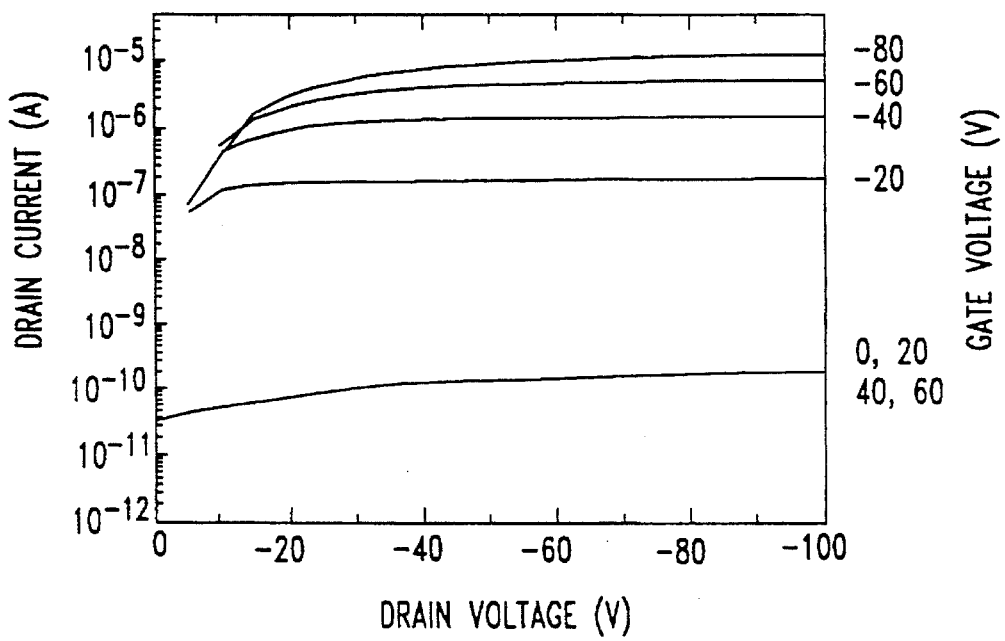

FIG. 5 shows analogous results for a TFT as described above, but with α-6T of somewhat higher conductivity (approximately $1.4 \times 10^{-8}$ S/cm) due to adventitious impurity doping. The carrier mobility was about $1-2 \times 10^{-2}$ cm$^2$/V·s, and the on/off ratio was greater than $10^6$ for gate voltages between 20 V and −80 V.

As can be seen from the above comparative results, material preparation is a significant aspect of TFTs according to the invention. We will next describe a novel method of making α-6T that can yield material of very low conductivity, exemplarily $\leq 5 \times 10^{-8}$ S/cm at 20° C. Use of such material in a TFT can result in very low off-current, a feature that inter alia can result in high on/off ratio and good dynamic response of the TFT. The closely related compounds α-8T and α-4T can be made by substantially the same method.

Material Preparation

Reagent grade α-terthienyl was dissolved in about three times its weight of toluene and applied to a column of ten times its weight of silica gel packed with hexane in a chromatography column. The α-terthienyl was eluted from the column with hexane and the eluate was concentrated in vacuum. This purified α-terthienyl (4.5 g) was placed in a round-bottom flask equipped with a magnetic stir bar, and 400 ml of tetrahydrofuran (THF), freshly distilled from sodium benzophenone ketyl, was added. The flask was capped with a rubber stopper. The solution was then purged with nitrogen, and cooled (with magnetic stirring) under nitrogen to <−70° C. A syringe containing 7.3 ml of 2.5M n-butyllithium in hexane was emptied into the flask via a needle through the stopper over 10 min., followed by stirring for 20 additional minutes below −70° C., resulting in formation of a substantial quantity of α-terthienyl de-protonated in the 5 position, namely, 5-lithio-α-terthienyl. A precipitate formed. The resulting suspension was added via a cannula to a second stirred flask containing a non-halogenating oxidizing agent, e.g., 6.4 g of reagent grade ferric acetylacetonate, and 150 ml of the THF, cooled to <–70° C. under nitrogen. The low temperature was maintained for one hour after the addition; then the mixture was allowed to warm to ambient temperature over 5–20 hours. The remaining part of the procedure is directed towards isolation of the ==-6T.

The suspended solids were collected by vacuum filtration and washed in sequence with 100 ml of ethyl ether, 300 ml of 1% HCl in water, 300 ml of (DI) water, 100 ml of ethanol, and 100 ml of ether, yielding 3.5 g of crude solid product. The solid was further washed with 100 ml each of 0.1% $Na_2CO_3$ in water, water, water again, ethanol, methyl ethyl ketone, and toluene, all heated to just below boiling and with vigorous shaking to prevent bumping. The undissolved solids were extracted with an inert solvent with boiling point >120° C., e.g., 800 ml of boiling mesitylene under nitrogen for one hour. The extract was filtered at the boiling point through a funnel heated with the vapors of the same solvent (e.g., mesitylene) that was boiling in the receiving flask. The filtrate was allowed to cool to ambient temperature, and crystals were obtained. The supernatant was separated from the crystals by suction filtration and used to further extract the undissolved solids. A total of 1.5 g of crystals were obtained. Portions of 200–300 mg of the thus produced crystals were placed at the bottom of a glass sublimator measuring 5 cm in diameter and 6–12 cm high. The material was sublimed >1 cm along the glass tube by heating at about 300° C. and $10^{-4}$ torr. After cooling under vacuum to ambient temperature, the sublimed material was scraped from the glass tube.

The above described exemplary novel method of making α-6T comprises features. that can significantly affect product quality. Among these is the use of a non-halogenating oxidizing agent, exemplarily ferric acetylacetonate. We have made the surprising observation that prior art α-6T (e.g., α-6T made with cupric chloride) contains significant amounts (typically 0.1–1 weight percent) of chlorine. To the best of our knowledge, the presence of this undesirable constituent was unknown up to now, and its substantial absence (less than 0.1 weight % chlorine or other halogens, preferably less than 0.05 weight %) from α-6T according to the invention is a significant aspect of the invention that is considered important for attainment of desirably low conductivity and/or high mobility. The α-6T made according to the above described method thus typically differs significantly from prior art α-6T with regard to elemental analysis.

Preferred methods of making α-6T also comprise solid extraction with an inert solvent with boiling point greater than 120° C., exemplarily mesitylene, and isolation of the α-6T by crystallization of the extract. The preferred methods further comprise a multi-step washing sequence applied to the (pre-washed) crude solid product, and sublimation of the washed solid product along a significant distance, typically >1 cm.

Figure 8:
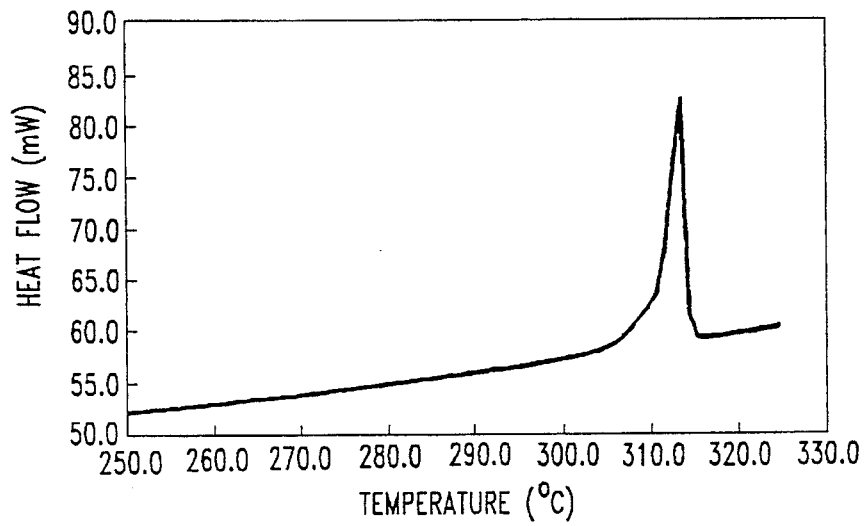
FIG. 8 shows exemplary differential scanning calorimetry data for α-6T according to the invention.

We have also made the surprising discovery that α-6T made according to the above described method has a melting point that differs substantially from reported melting points of prior art α-6T, which are in the range 280°–307° C. Specifically, using differential scanning calorimetry under nitrogen, we found the melting point of the novel α-6T to be about 313° C., as demonstrated by FIG. 8.

Figure 6:
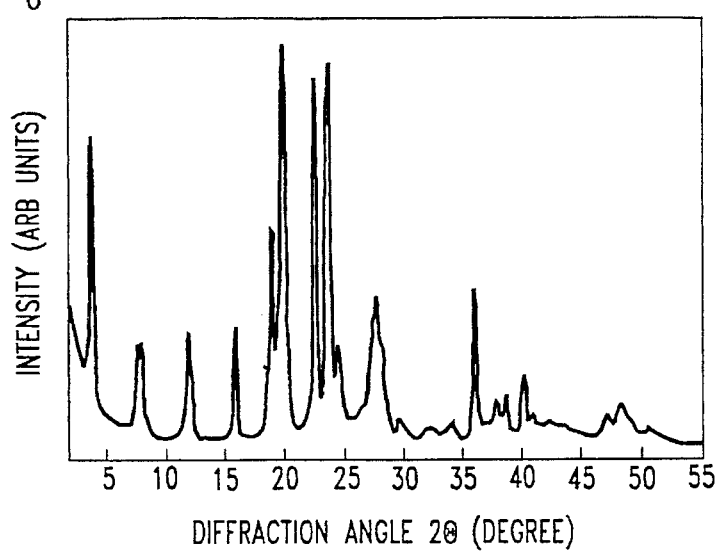
FIGS. 6 and 7 show the X-ray diffraction pattern of, respectively, α-6T according to the invention, and an exemplary prior art α-6T.
Figure 7:
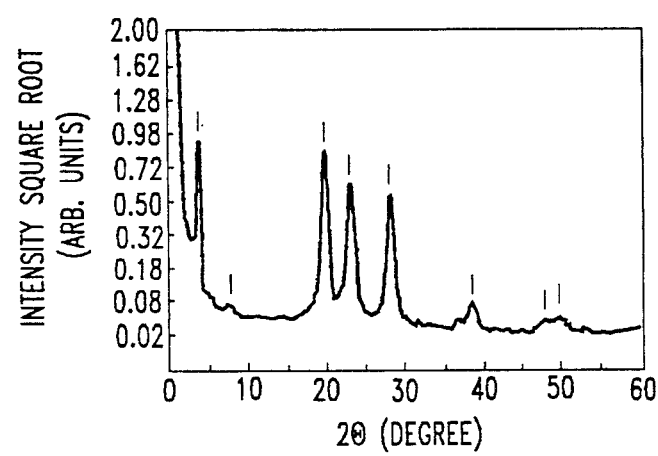

Furthermore, we have found significant differences between the X-ray diffraction patterns of α-6T made according to the novel method and published diffraction patterns of prior art α-6T, as demonstrated by FIGS. 6 and 7. The former pertains to α-6T according to the invention, and the latter is the published diffraction pattern of a prior art α-6T. See B. Servet et al., *Advanced Materials,* Vol. 5(6), p. 461 (1993).

Generally speaking, material according to the invention has more numerous and sharper X-ray peaks. Specifically, in α-6T according to the invention the prior art peaks (see the above cited article by B. Servet et al.) at about 20° and 22.5° each are resolved into at least two peaks.

The above discussed observations indicate that α-6T according to the invention is a material that can give rise to evaporated films that can exist in a more stable, more dense and better ordered crystalline form than prior art α-6T. Indeed, electron microscopy has confirmed that as-deposited films of α-6T according to the invention (deposited on a substrate at room temperature) can consist of large, anisotropic platelets with lengths of 100–200 nm that are clearly interconnected. This is to be contrasted with similarly deposited prior art α-6T films which are reported to have grain sizes of 50 nm, with the isotropic grains more or less separated from each other (B. Servet et al., *Chemistry of Materials,* Vol. 6, (1994), p. 1809). These structural differences are reflected in differences in carrier mobility. The α-6T films according to the invention can have mobility of about $10^{-2}$ cm$^2$/V·s, whereas the above described prior art material was reported to have mobility of only $2 \times 10^{-3}$ cm$^2$/V·s.

We currently believe that the above discussed improved properties are important for attainment of the improved device performance, e.g., for attainment of a high on/off ratio of the source/drain current. In particular, we believe that halogen content below 0.1 weight % (preferably below 0.05 weight %) is an important aspect of active layer material according to the invention, since active layer material with higher halogen content is likely to have relatively low carrier mobility.

Those skilled in the art will appreciate that the above described method of making α-6T is exemplary, and that modifications of the method are possible. For instance, alternative inert solvents (e.g., xylene) of similar polarity to that of mesitylene may be used, other metal-alkyl reagents (e.g., sec-butyllithium) may be used instead of n-butyllithium, and other non-halogenating oxidizing agents (e.g., ferric trifluoro-acetylacetonate, manganese (III) acetylacetonate) may be used. Furthermore, the method is not limited to the synthesis of α-6T but applies, with obvious modifications (e.g., starting material, quantities and temperatures of solvents, sublimation temperature and pressure), also to the preparation of α-4T and α-8T, and to the preparation of closely related compounds such as the end-substituted derivatives of α-6T, α-4T and α-8T. Furthermore, at least the purification aspects of the novel method are expected to be applicable, with obvious modifications (e.g., use of solvents of appropriate polarity and boiling point, sublimation temperature and pressure) to other related compounds such as α-5T, α-7T and α-9T, and their 4 or 5 substituted derivatives.

An appropriate quantity (e.g., 50 mg) of α-6T produced as described above was placed into a conventional tungsten boat in a conventional evaporator system. The base pressure in the evaporation chamber was about $10^{-7}$ torr. The boat was heated to about 300° C., and a 50 nm thick α-6T film was deposited uniformly over an appropriate substrate at room temperature. The as-deposited material typically was polycrystalline, with average grain size of order 100 nm.

We have found that an appropriate heat treatment of the as-deposited α-nT can change the morphology of the layer, and potentially further improve device characteristics. More specifically, we have found that rapid thermal annealing (RTA) of as-deposited films of, e.g., α-6T can substantially increase the grain size of the material, to the extent that average grain size can be comparable to or even exceed the channel length (typically 4–12 μm) of the intended TFT. If this is the case then the active layer can behave substantially like a single crystal layer.

Annealing an as-deposited α-6T film for a short time (typically less than 10 seconds, e.g., 1 second) at a temperature close to (optionally even slightly above) the melting point (e.g., 295°–315° C.) exemplarily has resulted in increase of the average grain size to above 2 μm, e.g., in the range 5–100 μm. Annealing is desirably done in an inert atmosphere, e.g., $N_2$. Any suitable heat source (e.g., a bank of halogen lamps focused to a susceptor, or a graphite strip heater) can be used. It is anticipated that the morphology of the other α-nTs can also be improved by appropriate RTA.

Furthermore, we have discovered that RTA of as-deposited p-type α-6T films can result in substantial decrease of the conductivity, with consequent increase in on/off ratio. For instance, a as-deposited α-6T layer exhibited a conductivity of about $10^{-6}$ S/cm. After a RTA (296° C. for 1 second) in $N_2$, the layer exhibited a conductivity of $0.7 \times 10^{-8}$ S/cm. It is expected that other members of the group α-nT will show similar conductivity decreases.

TFFs according to the invention can be produced in substantially the same way as analogous prior an TFTs, provided that a α-nT of the required low conductivity is used. Exemplary substrates are glass, plastics such as MYLAR® or KAPTON®, or Si (coated with $SiO_2$ or other insulator). Use of encapsulant that protects the active layer material is contemplated.

Transistors according to the invention can be used as discrete devices but will more typically be used in integrated circuits that comprise a multiplicity of transistors according to the invention, possibly in conjunction with conventional semiconductor devices, with conductors interconnecting the devices and providing means for energizing the devices, providing input signals to the circuit and optionally receiving output signals therefrom.

Figure 9:
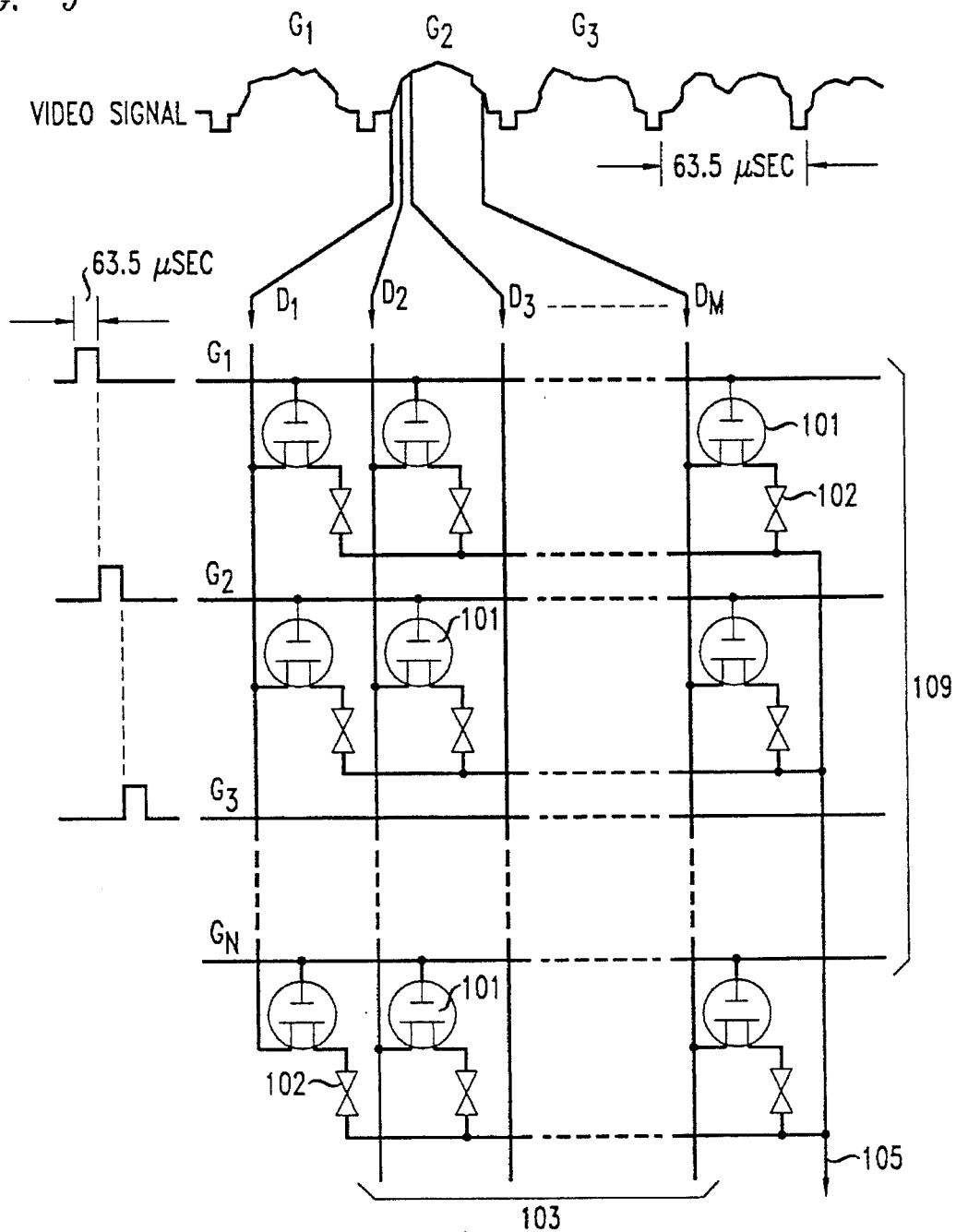
FIG. 9 shows an exemplary drive circuit in an active matrix liquid crystal display that comprises TFTs according to the invention.

By way of example, transistors according to the invention are used as current switches in liquid crystal displays in functionally the same way as prior art semiconductor TFTs are currently used. This is schematically illustrated in FIG. 9, which is based on an illustration at p. 102 of "Amorphous and Microcrystalline Devices", J. Kanicki, editor, Artech House, Boston (1991). FIG. 9 depicts relevant aspects of an exemplary circuit diagram of an active-matrix liquid crystal display, wherein transistors 101 are TFTs according to the invention, and the remainder of the circuit is conventional. Numerals 102 refer to liquid crystal, and numerals 103–105 refer to signal lines, gate lines and common electrode, respectively. Video signals and gate pulses are also shown schematically.

We claim:
1. An article comprising a thin film transistor comprising
    a) a layer of organic semiconductor material;
    b) spaced apart first and second contact means in contact with said layer; and
    c) third contact means that are spaced from said first and second contact means and that are adapted for controlling, by means of a voltage applied to the third contact means, a current between the first and second contact means through said layer; CHARACTERIZED IN THAT
    d) the organic semiconductor material is selected from the group consisting of α-nT without substituent on the 4- or 5-carbon on the terminal ring, and α-nT with substituent on the 4- or 5-carbon on the terminal ring, with n being an integer from 4 to 9; and
    e) the organic semiconductor material has an electrical conductivity of at most $5 \times 10^{-8}$ S/cm at 20° C., and furthermore has a charge carrier mobility of at least $10^{-3}$ cm$^2$/V·s at 20° C.

2. An article according to claim 1, wherein the organic semiconductor material is selected from at least one of α-6T and α-8T without said substituent, and α-6T and α-8T with said substituent.

3. An article according to claim 1, wherein the organic semiconductor material contains less than 0.1 weight percent halogen.

4. An article according to claim 3, wherein the organic semiconductor material is α-6T and has a melting point of about 313° C.

5. An article according to claim 4, wherein the layer of organic semiconductor material is a polycrystalline layer with average crystallite size of at least 2 μm.

6. An article according to claim 1, wherein the thin film transistor has an on/off ratio of a source/drain current greater than $10^5$.

7. An article according to claim 1, wherein the organic semiconductor material has a conductivity of at most $5 \times 10^{-8}$ S/cm in the as-deposited condition.

* * * * *